United States Patent
Robbins

(10) Patent No.: US 6,365,229 B1
(45) Date of Patent: Apr. 2, 2002

(54) SURFACE TREATMENT MATERIAL DEPOSITION AND RECAPTURE

(75) Inventor: Roger A. Robbins, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/406,386

(22) Filed: Sep. 27, 1999

Related U.S. Application Data

(60) Provisional application No. 60/102,438, filed on Sep. 30, 1998.

(51) Int. Cl.$^7$ .......................... C23C 14/00; C23C 14/12; C23C 16/00; B05D 3/02
(52) U.S. Cl. .......................... 427/248.1; 427/255.14; 427/255.6; 427/314; 427/294; 118/715; 118/719; 118/726
(58) Field of Search .......................... 427/248.1, 255.14, 427/255.6, 314, 294; 118/719, 720, 726, 715

(56) References Cited

U.S. PATENT DOCUMENTS

| | | | |
|---|---|---|---|
| 5,015,503 A | * 5/1991 | Varrin, Jr. et al. | 427/255.2 |
| 5,174,468 A | * 12/1992 | Holderman | 220/571 |
| 5,296,258 A | * 3/1994 | Tay et al. | 427/96 |
| 5,331,454 A | * 7/1994 | Hornbeck | 359/224 |
| 5,411,769 A | 5/1995 | Hornbeck | |
| 5,583,688 A | 12/1996 | Hornbeck | |
| 5,602,671 A | 2/1997 | Hornbeck | |
| 5,728,222 A | * 3/1998 | Barbee et al. | 118/715 |
| 5,817,575 A | * 10/1998 | Han | 438/680 |
| 5,939,785 A | 8/1999 | Klonis et al. | |

* cited by examiner

Primary Examiner—Michael Barr
(74) Attorney, Agent, or Firm—Charles A. Brill; James Wade Brady, III; Frederick J. Telecky, Jr.

(57) ABSTRACT

A method and system for applying a surface treatment to an object. The system comprises: a source chamber (106) for holding a source of surface treatment material (102); a deposition chamber (112) enclosing the object to be treated (104); a recovery chamber (108); a supply of carrier gas (110); conduit (116) connecting the source chamber (106) to the deposition chamber (112) and the deposition chamber (112) to the recovery chamber (108) and for controlling the flow of the carrier gas between the source chamber (106), the deposition chamber (112) and the recovery chamber; and a heater (124) for heating the source chamber (106), the source of surface treatment material (102), the deposition chamber (112), an upper portion (120) of the recovery chamber (108), the carrier gas, and the conduit (116). When heated, the source material (102) evaporates into the carrier gas and is carried to the deposition chamber (112) where is attaches to the surface of the object being treated (104). The depleted carrier gas is then delivered to the cooler lower portion (122) of the recovery chamber (108) where it condenses out of the carrier gas. After the supply of material (102) is depleted, the system flow is reversed to reuse the remaining source material (102). Throughout the deposition process, the carrier gas and all system surfaces are held above the condensation point of the source material-laden carrier gas to prevent unwanted deposition of the source material (102).

14 Claims, 3 Drawing Sheets

SURFACE TREATMENT MATERIAL DEPOSITION AND RECAPTURE

CROSS-REFERENCE TO RELATED APPLICATIONS

This application claims priority under 35 U.S.C. § 119(e)(1) of provisional application Ser. No. 60/102,438 filed Sep. 30, 1998.

The following patents and/or commonly assigned patent applications are hereby incorporated herein by reference:

| Pat. No. | Filing Date | Issue Date | Title |
| --- | --- | --- | --- |
| 5,331,454 | Jan. 16, 1992 | July 19, 1994 | Low Reset Voltage Process for DMD |
| 5,411,769 | Sept. 29, 1993 | May 2, 1995 | Method of Producing Micromechanical Devices |
| 5,602,671 | Feb. 4, 1994 | Feb. 11, 1997 | Low Surface Energy Passivation Layer for Micromechanical Devices |
| 5,583,688 | Dec. 21, 1993 | Dec. 10, 1996 | Multi-Level Digital Micromirror Device |
| 5,939,785 | April 3, 1997 | Aug. 17, 1999 | Micromechanical Device Including Time-Release Passivant |

FIELD OF THE INVENTION

This invention relates to the field of surface treatments, more particularly to surface treatments for micromechanical devices, most particularly to systems and processes for the efficient application of surface treatments on micromechanical devices.

BACKGROUND OF THE INVENTION

Micromechanical devices are small structures typically fabricated on a semiconductor wafer using techniques such as optical lithography, doping, metal sputtering, oxide deposition, and plasma etching which have been developed for the fabrication of integrated circuits.

Digital micromirror devices (DMDs), sometimes referred to as deformable micromirror devices, are a type of micromechanical device. Other types of micromechanical devices include accelerometers, pressure and flow sensors, gears and motors. While some micromechanical devices, such as pressure sensors, flow sensors, and DMDs have found commercial success, other types have not yet been commercially viable.

Digital micromirror devices are primarily used in optical display systems. In display systems, the DMD is a light modulator that uses digital image data to modulate a beam of light by selectively reflecting portions of the beam of light to a display screen. While analog modes of operation are possible, DMDs typically operate in a digital bistable mode of operation and as such are the core of the first true digital full-color image projection systems.

Micromirrors have evolved rapidly over the past ten to fifteen years. Early devices used a deformable reflective membrane which, when electrostatically attracted to an underlying address electrode, dimpled toward the address electrode. Schlieren optics illuminate the membrane and create an image from the light scattered by the dimpled portions of the membrane. Schlieren systems enabled the membrane devices to form images, but the images formed were very dim and had low contrast ratios, making them unsuitable for most image display applications.

Later micromirror devices used flaps or diving board-shaped cantilever beams of silicon or aluminum, coupled with dark-field optics to create images having improved contrast ratios. Flap and cantilever beam devices typically used a single metal layer to form the top reflective layer of the device. This single metal layer tended to deform over a large region, however, which scattered light impinging on the deformed portion. Torsion beam devices use a thin metal layer to form a torsion beam, which is referred to as a hinge, and a thicker metal layer to form a rigid member, or beam, typically having a mirror-like surface: concentrating the deformation on a relatively small portion of the DMD surface. The rigid mirror remains flat while the hinges deform, minimizing the amount of light scattered by the device and improving the contrast ratio of the device.

Recent micromirror configurations, called hidden-hinge designs, further improve the image contrast ratio by fabricating the mirror on a pedestal above the torsion beams. The elevated mirror covers the torsion beams, torsion beam supports, and a rigid yoke connecting the torsion beams and mirror support, further improving the contrast ratio of images produced by the device.

Due to the very small size of the micromechanical devices, attractive forces between the various components of the micromechanical devices—most notably van der Waals force—are capable of overcoming the operational forces of the device. For example, van der Waals force creates an attraction, often referred to as stiction, between the micromirror and the underlying landing electrode that is capable of keeping the mirror permanently deflected—ruining the micromirror device.

One method of preventing the effects of van der Waals forces uses a surface treatment, or passivation layer to reduce the attraction between components of the micromechanical device. One such surface treatment is perfluorodecanoic acid (PFDA). PFDA is comprised of a COOH terminal group that bonds to the surfaces of the micromechanical devices, a $CF_3$ terminal group that is relatively inert, and a carbon chain linking the two terminal groups. Other surface treatments are also available. For example, similar molecules with either longer or shorter carbon chains also provide suitable surface treatments in some applications.

When applied to the plasma-cleaned metal surface of a micromechanical device, the PFDA forms a self-aligned monolayer of closely-packed molecules. The $CF_3$ terminal groups form the exposed surface of the monolayer leaving a relatively inert surface which prevents stiction between the component parts of the micromechanical device.

While PFDA solves the stiction problem in micromechanical devices, its application presents many difficulties. Existing methods are quite wasteful since virtually all of the PFDA to which the micromechanical device is exposed is exhausted as waste. PFDA is a toxic material and is disposed of as a toxic acid. Furthermore, existing application methods tend to both clog and corrode the application equipment used. Thus, existing methods risk exposure to toxic materials, create excessive hazardous waste, have high labor costs to maintain equipment, and are wasteful of the raw PFDA material. What is needed is a better system and method for the application of the surface treatments.

SUMMARY OF THE INVENTION

Objects and advantages will be obvious, and will in part appear hereinafter and will be accomplished by the present invention which provides a method and system for the efficient deposition and recapture of a surface treatment material. According to one embodiment of the claimed invention, a method of applying a surface treatment. The method comprising the steps of providing a surface treatment material, typically PFDA, in a source chamber; evacuating a deposition chamber enclosing an object to be treated; heating the source chamber, the deposition chamber, the object, and an upper portion of a recovery chamber to a temperature above the evaporation point of the surface treatment material; heating the surface treatment material in the presence of a carrier gas to evaporate the surface treatment material; exposing the object to the carrier gas and the evaporated surface treatment material; removing the carrier gas and the evaporated surface treatment material to the recovery chamber; and recovering the evaporated surface treatment vapor or material in the recovery chamber. The surface treatment material is typically recovered in a lower portion of the recovery chamber, which is maintained at a temperature below the freezing point of the PFDA vapor.

The evaporated surface treatment material is typically recovered by condensing the evaporated surface treatment in a removable lower portion of said recovery chamber. Multiple deposition chambers are optionally used with the deposition system, and each deposition chamber is independently emptied and refilled with objects to be treated between delivery of the surface treatment-charged carrier gas. After the supply of source material is exhausted, the source chamber may be cleaned by opening a lower portion of the source chamber.

The system is reversed by the additional steps of: cooling a lower portion of the source chamber; heating the lower portion of the recovery chamber to evaporate the recovered source material into the carrier gas; transferring the evaporated recovered source material and the carrier gas into the deposition chamber; removing the carrier gas and the evaporated recovered surface treatment material to the source chamber; and condensing the evaporated recovered surface treatment material in the lower portion of the source chamber.

According to another embodiment, a system for applying a surface treatment to an object is disclosed. The system comprises: a source chamber for holding a source of surface treatment material; a deposition chamber enclosing the object; a recovery chamber; conduit connecting the source chamber to the deposition chamber and the deposition chamber to the recovery chamber and controlling the flow of a carrier gas between the source chamber, the deposition chamber and the recovery chamber; a supply of the carrier gas; and a heater for heating the source chamber, the source of surface treatment material, the deposition chamber, an upper portion of the recovery chamber, the carrier gas, and the conduit.

In operation, the heater evaporates the surface treatment material from the source container into the carrier gas, the conduit transfers the evaporated surface treatment material into the deposition chamber where a portion of the evaporated surface treatment material is deposited on the object, the conduit further transferring a remaining portion of the surface treatment material to the recovery chamber where it condenses in a lower portion of the recovery chamber.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1:
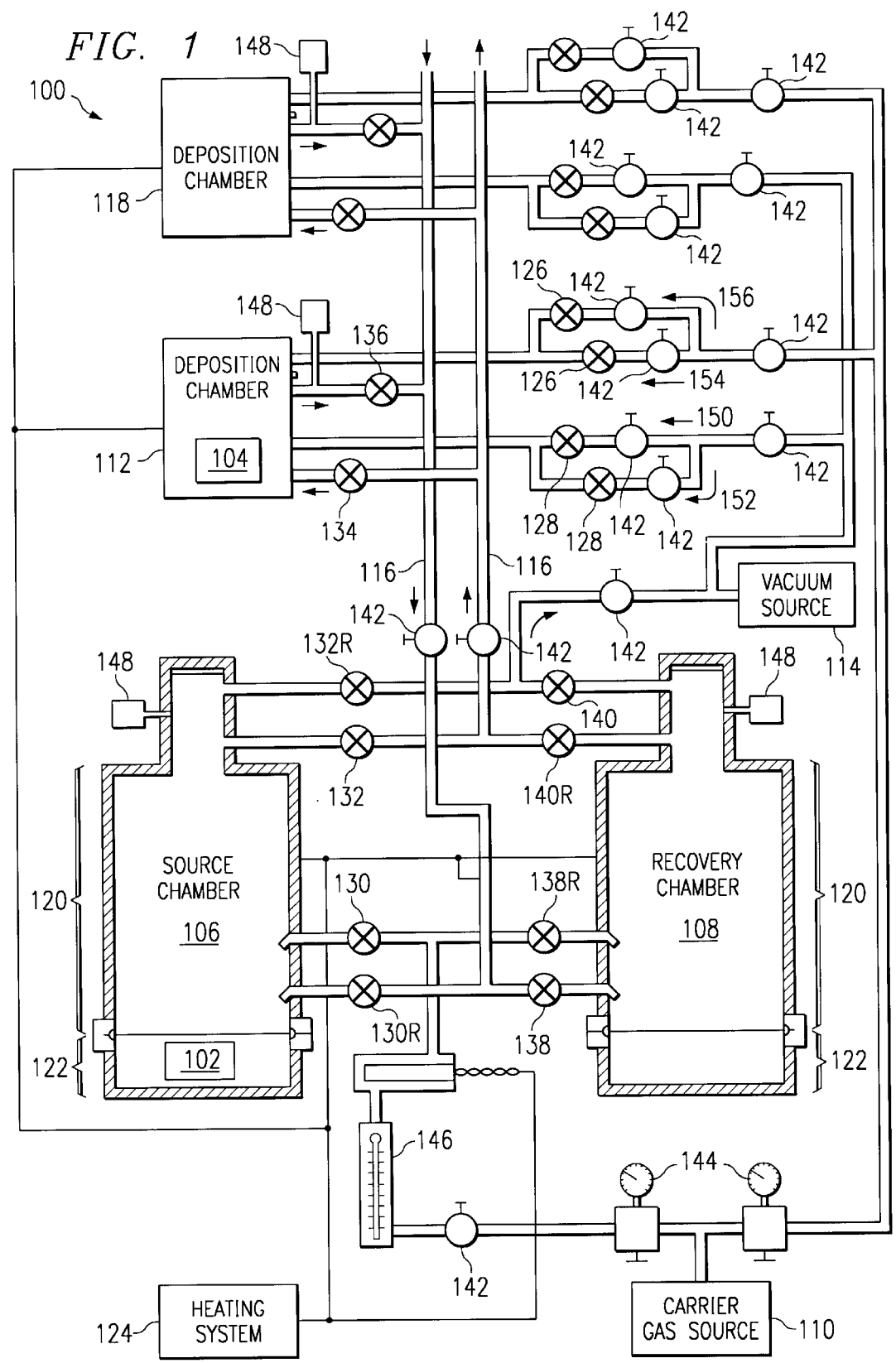
FIG. 1 is a schematic view of a system for depositing and recovering a surface treatment material.

A system 100 for depositing and recovering a surface treatment material is shown in FIG. 1. The system 100 shown in FIG. I allows a surface treatment material 102, such as the supply of PFDA, to be deposited on an object 104, typically a micromechanical device such as micromirror device, while avoiding excessive waste of the surface treatment material 102 and while minimizing unwanted accumulation of the material 102 throughout the system 100.

Although the examples taught by this disclosure will describe the conditions necessary to deposit PFDA 102 on a micromirror 104, these examples have been chosen for purposes of illustration—not for purposes of limitation. Other source materials and objects are equally applicable to the methods taught herein, typically with various changes to the pressures and temperatures taught herein.

The system 100 shown in FIG. 1 is comprised of six major components: a source chamber 106, a recovery chamber 108, a carrier gas source 110, a deposition chamber 112, a vacuum source 114, and a network of conduit 116. Additional deposition chambers, such as deposition chamber 118, are often connected to the conduit 116 to allow the surface treatment to be applied to many more objects.

Source chamber 106 and recovery chamber 108 are typically identical metal canisters comprised of an upper portion 120 and a removable lower portion 122. The material forming source chamber 106 and the recovery chamber 108 must be selected to avoid chemical reactions with the surface treatment material 102. Source chamber 106 and recovery chamber 108 are typically 316 stainless steel, which is sufficiently impervious to the evaporated PFDA to which the chambers are exposed.

Evaporated PFDA will attack the Cr, Fe, and Co in the 316 stainless steel, but only at a rather slow rate. The lower portions 122 of the supply chamber 106 and the recovery chamber 108 are exposed to much higher concentrations of PFDA since the melted source material 102 is present in the lower portions 122, or lids, of the chambers. The lower portions of the chambers are chrome plated to prevent excessive corrosion of the lower portions 122 of the chambers.

Conduit 116 is any necessary ductwork, tubing, or pipe necessary to interconnect the source chamber 106, recovery chamber 108, and carrier gas source 110. Conduit 116 also includes valves, gauges, flowmeters, flow regulators, and pressure regulators that aid in the control and monitoring of the deposition process.

Heating system 124 heats various portions of the system 100 during the deposition process. Although shown as a single heating system 124, it should be understood that the heating system 124 is typically comprised of multiple heating elements distributed throughout the system 100. For example, separate heating elements typically heat the upper and lower portions of the source chamber 106 and the recovery chamber 108. Likewise, both the deposition chamber 112 and the carrier gas source 110 typically have individual heaters. Additionally, a strip heater is typically wrapped around conduit 116, and conduit 116 is insulated, to control the temperature of the gases inside the conduit 116.

Carrier gas source 110 is typically a pressurized tank of nitrogen. Nitrogen is chosen since it is a widely available inert gas. As described in more detail below, a carrier gas is used to prevent accidental condensation of the PFDA should the evaporated PFDA cool slightly during the deposition process. Vacuum source 114 is used to evacuate the deposition chamber 112 and the conduit 116 as necessary during the deposition of the surface treatment.

The goal of the deposition process is to evaporate a quantity of the source material 102, transfer the evaporated source material 102 to the deposition oven 112 where a portion of the evaporated material 102 will form a surface layer on the object 104, and then transfer the evaporated source material to a recovery chamber 108 where the source material 102 is recovered.

One of the primary shortcomings of prior system for depositing the PFDA on a micromechanical device was the condensation of the evaporated PFDA throughout the system. This condensation occurred whenever the PFDA vapor cooled below the dew point, either due to passage through unheated portions of the system, heat losses, or when entering a vacuum after the deposition process. The condensed PFDA quickly constricted the conduits through which the PFDA vapor passed, and required regular cleaning and removal. The condensed PFDA vapor also corroded the portions of the system on which it condensed.

The amount of PFDA in the carrier gas and the temperature of the carrier gas are regulated to prevent unwanted deposition of the PFDA throughout the system 100. The temperatures at which the deposition process is performed are carefully chosen to prevent unwanted condensation. PFDA is an ideal substance for use in this system because it melting point, 87° C., is well above room temperature, 25° C., yet low enough to be easily achieved using common heating equipment. Furthermore, because the deposition of PFDA is an exothermic process, holding the deposition chamber 112 at too high of a temperature will slow the deposition process since the energy released by the exothermic deposition cannot be efficiently dissipated. Additionally, the partial pressure of the PFDA is a function of the temperature of the carrier gas stream.

To provide some margin for accidental cooling, the deposition process is performed at a temperature well above the melting point of the source material. For example, the deposition is performed at least 10° C. above the melting point of the source material. When depositing PFDA, the deposition process is performed at a temperature of at least 100° C., and optimally at 105° C., 18° C. above the melting point of the PFDA.

The use of a carrier gas also prevents accidental deposition of the PFDA. Without a carrier gas, the evaporated PFDA would condense on any surface cooler than the PFDA vapor. The carrier gas enables the use of an unsaturated vapor. The partial pressure of the PFDA, which determines the temperature at which PFDA will condense out of the carrier gas, is controlled by regulating the flow of the carrier gas and the temperature of the source chamber 106. Flow regulators 142 and pressure regulators 144 located at various points along conduit 116 regulate the flow of the gasses through the system. Likewise, flow monitor 146 and gauges 148 allow the deposition process to be monitored.

Figure 2:
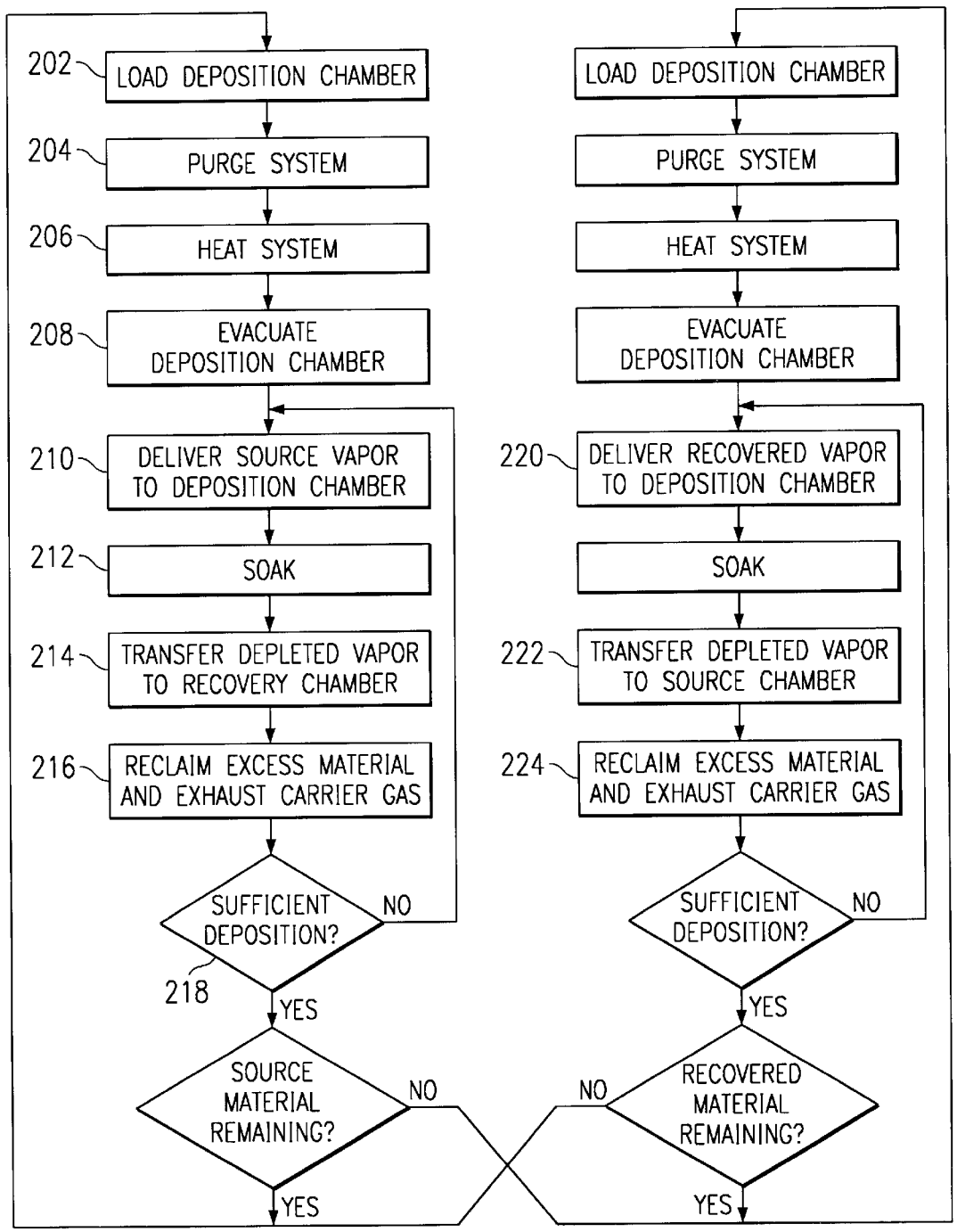
FIG. 2 is a flowchart detailing one surface treatment process using the system of FIG. 1.

FIG. 2 is a flowchart of the deposition process 200. The following description of the deposition process will make simultaneous reference to both the steps shown in FIG. 2 and the system components shown in FIG. 1. The first step of the deposition process is to load the micromirrors 104 and, if necessary, the source material 102 into the system 100. The system is then purged by removing the air and replacing it with the carrier gas, in this case nitrogen, by opening valves 126 and 128. The system pressure after this step is 600 torr, well below atmospheric pressure of 760 torr.

Heating system 124 heats the deposition system 100 in step 206, except for the lower portion 122 of the recovery chamber 108, to a temperature sufficient to evaporate the source material—typically 105° C. After the system is heated, the deposition chamber is evacuated in step 208. This step 208, which holds the deposition chamber at a vacuum for about 30 minutes, removes any moisture that may have been present in the chamber or the objects 104 to be treated. The evacuation step 208 may be performed while the system is being heated. Alternatively, the source material is not heated until after the moisture is removed from the objects being treated.

A small amount of the carrier gas is delivered to the deposition chamber at the end of step 208 to raise the pressure in the chamber to roughly 20 to 30 torr. This small amount of gas prevents the PFDA-laden carrier gas from chilling below its dew point when it is delivered to the chamber in step 210—which would allow the PFDA to condense out of the vapor.

FIG. 1 shows parallel paths between the vacuum source 114 and the deposition chamber 112, and between the carrier gas source 110 and the deposition chamber 112. One path 150 is designed to provide a high-flow connection between the vacuum source 114 and the deposition oven 112, while the parallel path 152 provides a low-flow connection. Likewise, path 154 provides a high-flow connection between the carrier gas source 110 and the deposition oven 112, while the parallel path 156 provides a low-flow connection. The parallel paths provide control over the flow of gases into and out of the deposition chamber 112. For example, small amount of carrier gas necessary to raise the pressure of the deposition chamber 112 to 20–30 torr is provided using the low-flow carrier gas path 156 in combination with the high-flow path 150 between the vacuum source 114 and the deposition oven 112. Micromirror devices can be damaged if gases are allowed to enter or exit the deposition chamber too quickly. High flow rates stir up dust in the deposition chamber which contaminates the devices. Rapid pressure changes tear the mirrors from the devices.

An alternative to separate high-flow and low-flow paths uses flow controllers and auto pressure regulators to adjust the flow of the gases. The embodiment shown in FIG. 1, however, provides sufficient control over the gases and is less expensive.

Returning to FIG. 2, the source material begins melting as the system is heated in step 206. When valves 130, 132, and 134 are opened, in step 210, the melted PFDA evaporates into the carrier gas entering the source chamber 106. This PFDA-laden carrier gas is delivered to the deposition chamber 112. As the PFDA-laden carrier gas is delivered, valves 136, 138, and 140 are opened to ensure the PFDA vapor is delivered all the way to the deposition chamber 112.

During soak step 212, all valves are shut and the PFDA-laden carrier gas is allowed to remain the in deposition chamber 112 for a period in which the deposition takes place. The speed at which the deposition occurs is dependent on the amount of PFDA in the carrier gas and the temperature of the system. The PFDA does not condense out of the gas onto the micromirror 104, but rather reacts with the micromirror surfaces to form a monolayer. The PFDA also forms a monolayer on the inner surfaces of the deposition chamber 104, source chamber 106, recovery chamber 108, and conduit 116, but unlike the constricting waste formed by condensation, the monolayer that forms on the inside of the deposition system 100 is self-limiting to a one molecule thick layer.

After the soak period in step 212, valves 126, 136, 138, and 140 are opened to allow the depleted vapor to be transferred to the recovery chamber in step 214. Although the PFDA in the PFDA-laden carrier gas from the oven 112 has been partially depleted, the vast majority of the evaporated PFDA remains in the carrier gas. Because only the upper portion of the recovery chamber 108 is heated, the PFDA remaining in the carrier gas condenses out of the carrier gas and is deposited in the lower portion of the recovery chamber 108 where it can be reclaimed, and the carrier gas can be exhausted, in step 216.

At this point, the process typically is finished and the deposition chamber 112 is opened and the micromirrors 104 are removed and replaced with untreated devices. If additional PFDA deposition is required, however, as in the case where the PFDA is deposited into getters attached to the package windows, the deposition cycle is repeated as indicated by step 218. Although not shown in FIG. 2, if an additional deposition is required but an insufficient quantity of the source material remains in the source chamber, the recovered material from the recovery chamber is used, or additional source material is added to the system. The deposition cycle is repeated with additional devices or windows until the source of surface treatment material is depleted.

When the original source of surface treatment material is depleted, the vast majority of the material is located in the recovery chamber 108 where it has condensed in the cooler lower portion 122 of the chamber. The recovered PFDA in the recovery chamber 108 is used as the source material and the path of the PFDA-laden carrier gas is reversed. When the process is reversed, the recovered PFDA is evaporated in the recovery chamber 108 and delivered to the deposition chamber 112 as indicated by step 220. PFDA vapors that do not bond to the object being treated 104 are transferred to the source chamber 106 in step 222. The lower portion 122 of the source chamber 106 is cooled—causing the evaporated recovered PFDA to condense out of the carrier gas in step 224. Thus, the deposition cycle is reversed and repeated until the original supply of PFDA is exhausted. In FIG. 1, the valves used in the reverse-flow cycle are labeled with the number of the corresponding valve for the forward cycle followed by an "R" to indicate the reverse cycle.

Because the entire system is kept at an elevated temperature the entire time it is exposed to the PFDA-laden vapors, only a monolayer of the PFDA is deposited in the system chambers and conduit. Thus, there is no build-up of the PFDA in the system which would require disassembly and clean-out. Since the PFDA is consumed only by self-limiting monolayer deposited in the deposition system and the desired monolayer on the objects 104 being treated, there is virtually no waste, and the system, except for the deposition chamber 112, can remain closed while a great many objects are treated by recovering the excess material and reversing the flow of the material through the system. Keeping the system closed prevents contaminants from entering the system.

The purity of the PFDA vapor has a very large effect on the component yield. There are two classes of impurities in the PFDA: organic impurities that are included in the source PFDA material, and PFDA corrosion salts created when the hot PFDA attacks the metal chambers. The corrosion salts do not evaporate during the process and are easily removed by cleaning the lower portion of each chamber, both the source chamber 106 and the recovery chamber 108, as they are emptied.

Figure 3:
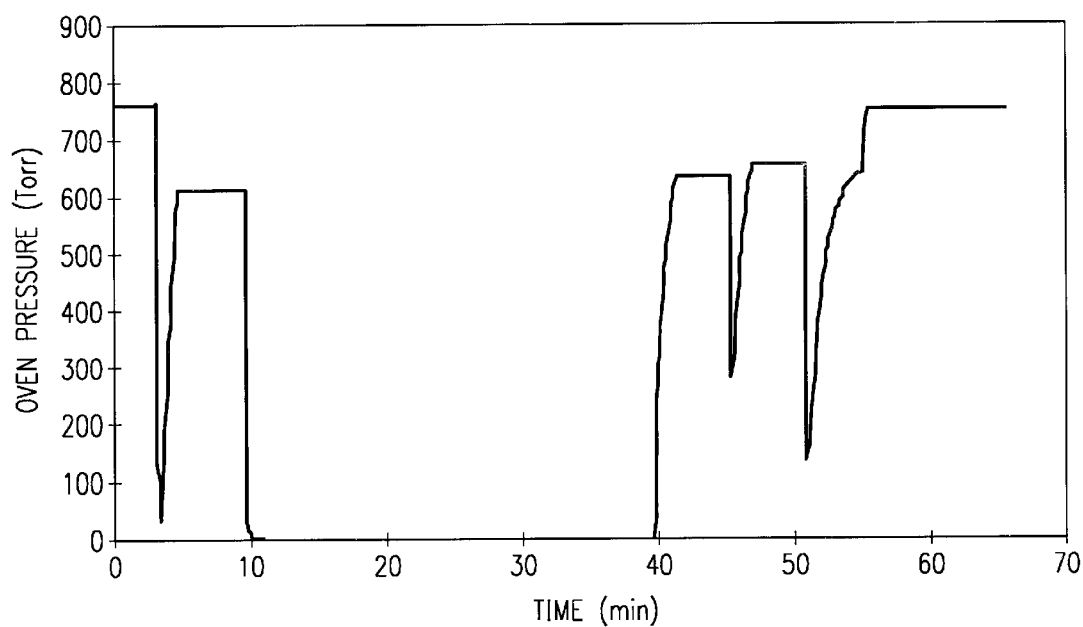
FIG. 3 is a plot of the system pressure over time as the system of FIG. 1 loads a surface treatment material into window getters used in micromirror device packages by a process similar to that described in FIG. 2.

FIG. 3 shows a pressure profile for the process of depositing the surface treatment material into the window getters of micromirror devices. When the process starts, the air is removed and replaced with carrier gas ($N_2$). The carrier gas is added until the pressure in the deposition chamber reaches 600 torr. This pressure is maintained for eight minutes to allow the system and the objects being treated to warm up.

The system is then evacuated for thirty minutes to remove all of the moisture from the window getters. At the end of the thirty minute evacuation step, a small amount of the carrier gas is delivered to the oven. This "puff" of carrier gas brings the deposition chamber pressure to between 20 and 30 torr—enough to prevent the PFDA vapor from chilling below its dew point and condensing the PFDA vapor when the PFDA vapor enters the deposition chamber.

The PFDA-laden carrier gas is then delivered to the deposition chamber while the vacuum path is open—ensuring the PFDA vapor is actually delivered all the way through the system and into the deposition chamber. After this delivery, the vacuum port is closed and the PFDA vapor stream fills the deposition chamber to a pressure of 600 torr. When the deposition chamber pressure reaches 600 torr, the delivery valve is shut.

The PFDA vapor remains in the deposition oven for four minutes to allow the PFDA vapor time to soak into the window getters. The depleted vapor is removed in a brief pump-down, and another load of PFDA-laden carrier gas is admitted into the deposition chamber to load additional PFDA into the window getters. This pump-down/delivery cycle is repeated until a sufficient amount of PFDA is stored in the window getters.

At the end of the final delivery cycle the system is purged with carrier gas. When processing window getters, this step must be performed as quickly as possible since the excess PFDA loaded in the window getters evaporates out of the window getters.

Thus, although there has been disclosed to this point a particular embodiment for an efficient surface treatment material deposition and recovery system and method thereof, it is not intended that such specific references be considered as limitations upon the scope of this invention except insofar as set forth in the following claims. Furthermore, having described the invention in connection with certain specific embodiments thereof, it is to be understood that further modifications may now suggest themselves to those skilled in the art, it is intended to cover all such modifications as fall within the scope of the appended claims.

What is claimed is:

1. A method of applying a surface treatment, said method comprising the steps of:

providing a surface treatment material in a source chamber;

evacuating a deposition chamber enclosing an object to be treated;

heating said source chamber, said deposition chamber, said object, and an upper portion of a recovery chamber to a temperature above the melting point of said surface treatment material;

heating said surface treatment material in the presence of a carrier gas to evaporate said surface treatment material;

exposing said object to said carrier gas and said evaporated surface treatment material;

removing said carrier gas and said evaporated surface treatment material to said recovery chamber;

recovering said evaporated surface treatment material in said recovery chamber;

cooling a lower portion of said source chamber;

heating a lower portion of said recovery chamber to evaporate said recovered surface treatment material into said carrier gas;

transferring said evaporated recovered surface treatment material and said carrier gas into a second deposition chamber;

removing said carrier gas and said evaporated recovered surface treatment material to said source chamber; and condensing said evaporated recovered surface treatment material in said lower portion of said source chamber.

2. The method of claim 1, said step of recovering comprising condensing said evaporated surface treatment material in a removable lower portion of said recovery chamber.

3. The method of claim 1, further comprising the step of cleaning said source chamber after said evaporation of said surface treatment material.

4. The method of claim 1, further comprising the step of purging said deposition chamber with an additional quantity of said carrier gas.

5. The method of claim 1, said step of providing a surface treatment material in a source chamber comprising the step of providing a quantity of PFDA in said source chamber.

6. The method of claim 1, said step of heating said source chamber, said deposition chamber, said object, and said upper portion of a recovery chamber comprising heating said source chamber, said deposition chamber, said object, and said upper portion of said recovery chamber to a temperature at least 10° C. above the melting point of said surface treatment material.

7. The method of claim 1, said step of heating said source chamber, said deposition chamber, said object, and said upper portion of a recovery chamber to a temperature above the melting point of said surface treatment material comprising heating said source chamber, said deposition chamber, said object, and said upper portion of said recovery chamber to a temperature of at least 100° C.

8. The method of claim 1, said step of heating said source chamber, said deposition chamber, said object, and said upper portion of a recovery chamber to a temperature above the melting point of said surface treatment material comprising heating said source chamber, said deposition chamber, said object, and said upper portion of said recovery chamber to a temperature of at least 105° C.

9. The method of claim 1, further comprising the steps of:

removing said object to be treated prior to said transferring step; and replacing said object with a second object prior to said transferring step.

10. A system for applying a surface treatment to an object, said system comprising:

a source chamber for holding a source of surface treatment material;

a first deposition chamber enclosing a first object to be treated;

a second deposition chamber enclosing a second object to be treated;

a recovery chamber;

a supply of a carrier gas;

conduit connecting said source chamber to said deposition chambers and said deposition chambers to said recovery chamber and controlling the flow of said carrier gas between said source chamber, said deposition chambers and said recovery chamber; and a heater for heating said source chamber, said source of surface treatment material, said deposition chambers, said recovery chamber, said carrier gas, and said conduit.

11. The system of claim 10, wherein said heater evaporates said source of surface treatment material into said carrier gas, said conduit transfers said evaporated surface treatment material into at least one of said deposition chambers where a portion of said evaporated surface treatment material is deposited on at least one said object to be treated, said conduit further transferring a remaining portion of said surface treatment material to said recovery chamber where it condenses in a lower portion of said recovery chamber.

12. The system of claim 10, wherein said recovery chamber comprises an upper portion and a removable lower portion.

13. The system of claim 10, further comprising a vacuum pump connected to said conduit, said vacuum pump operable to remove said carrier gas from said source chamber, said first and second deposition chambers, and said recovery chamber.

14. The system of claim 11, wherein said heater evaporates said remaining portion of said surface treatment material in said recovery chamber into said carrier gas, said conduit transfers said evaporated remaining portion of said surface treatment material into at least one of said deposition chambers where a portion of said evaporated surface treatment material is deposited on another object to be treated, said conduit further transferring a second remaining portion of said surface treatment material to said source chamber where it condenses in a lower portion of said source chamber.

* * * * *